(12) United States Patent
Park et al.

(10) Patent No.: US 8,466,454 B2
(45) Date of Patent: Jun. 18, 2013

(54) ORGANIC LIGHT EMITTING DIODE DISPLAY

(75) Inventors: Chan-Young Park, Yongin (KR);
Beom-Shik Kim, Yongin (KR); Hui Nam, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 76 days.

(21) Appl. No.: 12/826,308

(22) Filed: Jun. 29, 2010

(65) Prior Publication Data

US 2011/0006327 A1 Jan. 13, 2011

(30) Foreign Application Priority Data

Jul. 10, 2009 (KR) .................... 10-2009-0063229

(51) Int. Cl.
*H01L 29/08* (2006.01)
*H01L 35/24* (2006.01)
*H01L 51/00* (2006.01)

(52) U.S. Cl.
USPC ............... 257/40; 257/98; 359/237; 359/472; 359/462

(58) Field of Classification Search
USPC ................ 257/40, 98; 359/54, 237, 472, 462, 359/463
See application file for complete search history.

(56) References Cited

U.S. PATENT DOCUMENTS

| | | | |
|---|---|---|---|
| 5,315,377 A | 5/1994 | Isono et al. | |
| 6,069,650 A * | 5/2000 | Battersby | 348/59 |
| 7,058,252 B2 * | 6/2006 | Woodgate et al. | 385/16 |
| 7,199,845 B2 | 4/2007 | Koyama et al. | |
| 7,371,468 B2 * | 5/2008 | Mizusaki et al. | 428/690 |
| 2004/0207823 A1 * | 10/2004 | Alasaarela et al. | 353/122 |
| 2006/0176541 A1 * | 8/2006 | Woodgate et al. | 359/237 |
| 2006/0187179 A1 | 8/2006 | Karman et al. | |
| 2008/0231690 A1 * | 9/2008 | Woodgate et al. | 348/51 |

FOREIGN PATENT DOCUMENTS

| | | |
|---|---|---|
| JP | 2001-318341 | 11/2001 |
| JP | 2003142255 | 5/2003 |
| JP | 2003282241 A | 10/2003 |
| JP | 2008164702 A | 7/2008 |
| JP | 2008224930 A | 9/2008 |
| JP | 2009037812 | 2/2009 |
| JP | 2009053391 A | 3/2009 |
| JP | 2009098311 | 7/2009 |
| KR | 10-2007-0070381 | 7/2007 |
| KR | 1020080062523 A | 7/2008 |
| WO | 2007032132 | 3/2007 |

\* cited by examiner

*Primary Examiner* — Jarrett Stark
*Assistant Examiner* — John M Parker
(74) *Attorney, Agent, or Firm* — Robert E. Bushnell, Esq.

(57) ABSTRACT

An organic light emitting diode (OLED) display according to an exemplary embodiment includes a substrate main body, a plurality of organic light emitting elements formed on the substrate main body, an encapsulation thin film formed on the substrate main body thereby covering the plurality of organic light emitting elements, and a disparity barrier rib layer formed on a boundary region between the plurality of organic light emitting elements.

16 Claims, 4 Drawing Sheets

ORGANIC LIGHT EMITTING DIODE DISPLAY

CLAIM OF PRIORITY

This application makes reference to, incorporates into this specification the entire contents of, and claims all benefits accruing under 35 U.S.C. §119 from an application earlier filed in the Korean Intellectual Property Office on Jul. 10, 2009, and there duly assigned Serial No. 10-2009-0063229.

BACKGROUND OF THE INVENTION

1. Field of the Invention

The described technology relates generally to an organic light emitting diode (OLED) display. More particularly, the described technology relates generally to an organic light emitting diode (OLED) display displaying a three-dimensional image with high resolution.

2. Description of the Related Art

An organic light emitting diode (OLED) display has a self-emissive characteristic, and thus, unlike a liquid crystal display, does not need a separate light source. Therefore, the OLED display can be reduced in thickness and weight. In addition, since the OLED display has high-quality characteristics such as low power consumption, high luminance, fast reaction time, and the like, the OLED display is drawing attention as a next generation display device for a portable electronic device.

Recently, a requirement for a display device that realistically represents three-dimensional images has increased. A three-dimensional image may be displayed through a method in which images recognized by the left eye and the right eye of a viewer observing the display device are divided to be shown. That is, the three-dimensional image may be realized by generating a disparity for the images represented through the display device.

Accordingly, to effectively display three-dimensional images through the organic light emitting diode (OLED) display, a twist nematic (TN) mode liquid crystal is to disposed on the glass substrate covering the organic light emitting element, or a barrier rib is formed on the glass substrate to generate the disparity.

There is a problem in the configuration using the liquid crystal in that the transmittance of light is deteriorated in the process of passing through the liquid crystal layer. Accordingly, the overall luminance of the organic light emitting diode (OLED) display is deteriorated. Also, as the size of the organic light emitting diode (OLED) display is increased, the manufacturing process of the organic light emitting diode (OLED) display using the liquid crystal is more complicated and productivity is decreased. Further, the overall thickness of the organic light emitting diode (OLED) display becomes excessively thick such that it is difficult to satisfy the desire of the user for thinness.

In addition, the configuration including the barrier rib formed on the glass substrate may have a thinner thickness of the organic light emitting diode (OLED) display compared with the configuration using the liquid crystal; however, the thickness of the barrier rib is added to the thickness of the glass substrate such that the overall thickness of the organic light emitting diode (OLED) display is increased.

Further, according to several conditions such as the total size of the organic light emitting diode (OLED) display and the size of a pixel as a minimum unit displaying the image for the organic light minting diode (OLED) display, the barrier rib must be separated from the organic light emitting element by a predetermined interval to effectively form the three-dimensional image. When the barrier rib is formed on the glass substrate, however, it is difficult to appropriately control the distance between the barrier rib and the organic light emitting element.

The above information disclosed in this Background section is only for enhancement of understanding of the background of the described technology and therefore it may contain information that does not form the prior art that is already known in this country to a person of ordinary skill in the art.

SUMMARY OF THE INVENTION

It is therefore an aspect of the present invention to provide an improved organic light emitting diode display.

It is another aspect of the present invention to provide an organic light emitting diode display that can effectively display three-dimensional images of high resolution, and simultaneously realize overall slimness.

An organic light emitting diode (OLED) display according to an exemplary embodiment includes a substrate main body, a plurality of organic light emitting elements formed on the substrate main body, an encapsulation thin film formed on the substrate main body thereby covering the plurality of organic light emitting elements, and a disparity barrier rib layer formed on a boundary region between the plurality of organic light emitting elements.

One organic light emitting element among the plurality of organic light emitting elements may emit light of a color different from the color of the light emitted by at least one among neighboring organic light emitting elements.

The disparity barrier rib layer may generate a disparity for an image formed by light emitted from the plurality of organic light emitting elements.

The disparity barrier rib layer may be made of one of an organic layer and an inorganic layer including a light blocking component.

The disparity barrier rib layer may be separated from the plurality of organic light emitting elements by a distance in a range of approximately 0.1 μm to 10 μm.

The encapsulation thin film and the disparity barrier rib layer may be integrally formed.

The encapsulation thin film may have a thickness of approximately 0.1 μm to 10 μM.

The encapsulation thin film may have a multi-layer structure in which a plurality of inorganic layers are deposited.

The inorganic layer may be made of a material including at least one of $Al_2O_3$, $TiO_2$, ZrO, $SiO_2$, AlON, AlN, SiON, $Si_3N_4$, ZnO, and $Ta_2O_5$.

The disparity barrier rib layer may be disposed between the plurality of inorganic layers.

The disparity barrier rib layer may be disposed on the highest layer that is furthermost from the plurality of organic light emitting elements.

The encapsulation thin film may be formed with a multi-layer structure in which a plurality of inorganic layers and a plurality of organic layers are alternately deposited.

The inorganic layer may be formed of a material including at least one of $Al_2O_3$, $TiO_2$, ZrO, $SiO_2$, AlON, AlN, SiON, $Si_3N_4$, ZnO, and $Ta_2O_5$, and the organic layer may be made of a material selected from a polymer group.

The disparity barrier rib layer may be disposed between the plurality of inorganic layers and organic layers.

The disparity barrier rib layer may be disposed on the highest layer that is furthermost from the plurality of organic light emitting elements.

According to the present invention, the organic light emitting diode (OLED) display may effectively display three-dimensional images, and may simultaneously the overall thickness may be small.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
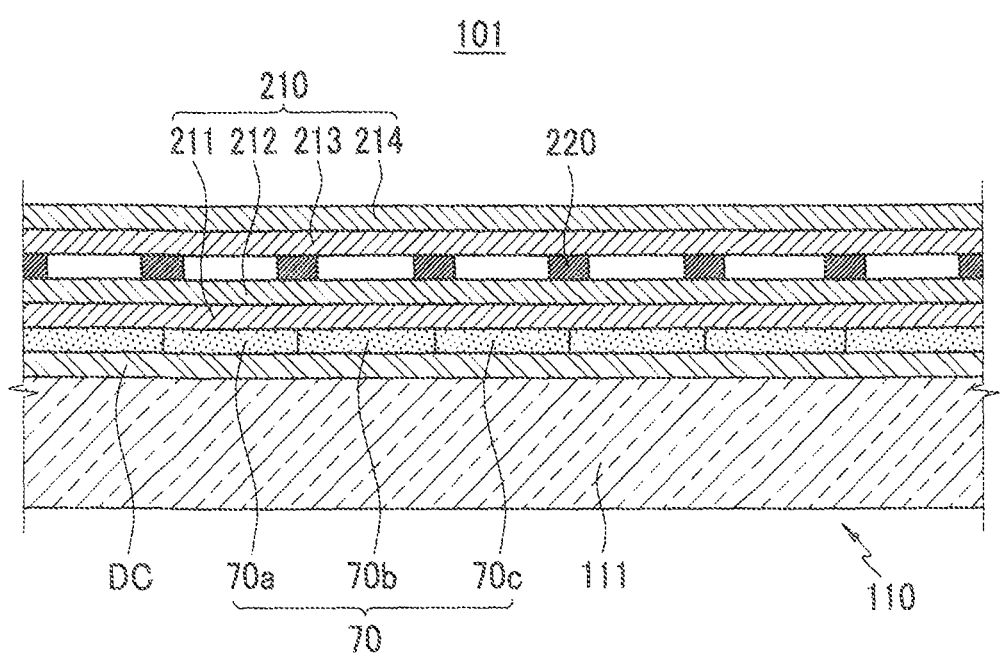
FIG. 1 is a cross-sectional view of an organic light emitting diode (OLED) display constructed as a first exemplary embodiment according to the principles of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the several exemplary embodiments, constituent elements having the same configuration are representatively described in the first exemplary embodiment by designating like constituent elements thereto, and other exemplary embodiments will be described only regarding differences from the first exemplary embodiment.

The drawings and description are to be regarded as illustrative in nature and not restrictive. Like reference numerals designate like elements throughout the specification.

In addition, the size and thickness of each element in the drawings are random samples for better understanding and ease of description, and the present invention is not limited thereto.

In the drawings, the thickness of layers, films, panels, regions, etc., are exaggerated for clarity and better understanding and ease of description. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a first exemplary embodiment will be described with reference to FIG. 1 to FIG. 3.

As shown in FIG. 1, an organic light emitting diode (OLED) display 101 constructed as the first exemplary embodiment according to the principles of the present invention includes a display substrate 110, an encapsulation thin film 210, and a disparity barrier rib layer 220.

Display substrate 110 includes a substrate main body 111, a driving circuit unit DC, and an organic light emitting element 70 formed on substrate main body 111. Organic light emitting element 70 displays visual images with an organic emission layer 720 (shown in FIG. 3) that emits light, and driving circuit unit DC drives organic light emitting element 70. Structures of organic light emitting element 70 and driving circuit unit DC are not limited to the structures shown in FIG. 1 to FIG. 3, and they may be variously modified within a range that can be easily realized by a person skilled in the art according to a direction of a visual image displayed by the light emitted from organic light emitting element 70.

Also, organic light emitting diode (OLED) display 101 displays visual images through a plurality of pixels. Here, a pixel is a minimum unit for displaying an image. Also, a plurality of organic light emitting elements 70 are formed for each pixel in display substrate 110.

One organic light emitting element 70b of a plurality of organic light emitting elements 70 emits light of a color different from the color of the light emitted by at least one of neighboring organic light emitting elements 70a and 70c. That is, organic light emitting elements 70a, 70b, and 70c emitting light of different colors may be alternatively arranged according to at least one of a column direction and a row direction. In an embodiment constructed according to the principles of the present invention, among plurality of organic light emitting elements 70 illustrated in FIG. 1, organic light emitting element 70a emits red light; organic light emitting element 70b emits green light; organic light emitting element 70c emits blue light; and organic light emitting elements 70a, 70b and 70c are arranged in the row direction.

Encapsulation thin film 210 is formed with a multi-layer structure including a plurality of inorganic layers 211, 212, 213, and 214. Here, inorganic layers 211, 212, 213, and 214 are made of a material including at least one of $Al_2O_3$, $TiO_2$, ZrO, $SiO_2$, AlON, AlN, SiON, $Si_3N_4$, ZnO, and $Ta_2O_5$.

Encapsulation thin film 210 protects organic light emitting element 70 by preventing moisture or oxygen from penetrating into organic light emitting element 70. Encapsulation thin film 210 must satisfy a water vapor transmission rate (WVTR) condition of less than 10E-6 $g/m^2$/day that is generally required for an organic light emitting diode (OLED) display.

Also, in FIG. 1, encapsulation thin film 210 is formed of four inorganic layers 211, 212, 213, and 214. The first exemplary embodiment is, however, not limited thereto. Accordingly, encapsulation thin film 210 may be variously formed of two or more inorganic layers, as necessary.

Disparity barrier rib layer 220 is formed on a boundary region between the plurality of organic light emitting elements 70. That is, disparity barrier rib layer 220 includes a plurality of barrier ribs, and each barrier rib is disposed corresponding to a boundary region between two immediately adjacent organic light emitting elements 70. Also, disparity barrier rib layer 220 generates a disparity of images formed by the light emitted from organic light emitting elements 70. The images displayed by organic light emitting diode (OLED) display 101 have the disparity generated by disparity barrier rib layer 220. In this way, a user that views organic light emitting diode (OLED) display 101 constructed with disparity barrier rib layer 220 respectively recognizes images that are divided into the left eye and the right eye of the user. Accordingly, organic light emitting diode (OLED) display 101 may provide three-dimensional images to the user. That is, an image is spatially separated by disparity barrier rib layer 220 into an image received by a left eye of a user (hereinafter referred to as a "left-eye image") and an image received by a right eye of the user (hereinafter referred to as a "right-eye image"), and therefore the user can receive the left-eye image and the right-eye image to recognize a three-dimensional image.

Disparity barrier rib layer 220 may be made of an organic layer or an inorganic layer including a light blocking component. That is, disparity barrier rib layer 220 may be formed of an organic material including a pigment such as carbon black or titanium oxide, to or an inorganic material including chromium, chromium oxide, chromium nitride, or other metal oxides.

To generate an appropriate disparity by disparity barrier rib layer 220, the plurality of organic light emitting elements 70 are separated from each other by a distance in a predetermined range. Herein, the predetermined range is equal to or more than 0.1 µm and equal to or less than 10 µm. If the distance between disparity barrier rib layer 220 and organic light emitting elements 70 is less than 0.1 µm, it is difficult for disparity barrier rib layer 220 to generate the appropriate disparity. On the other hand, if the distance between disparity barrier rib layer 220 and organic light emitting elements 70 is more than 10 µm, the overall thickness of organic light emitting diode (OLED) display 101 is significantly increased. Accordingly, the distance between disparity barrier rib layer 220 and organic light emitting elements 70 is in the range of 0.1 µm to 10 µm, and has an appropriate length when considering the overall size of organic light emitting diode (OLED) display 101 and the size of the pixel.

Also, as shown in FIG. 1, in the first exemplary embodiment, disparity barrier rib layer 220 is integrally formed with encapsulation thin film 210. Disparity barrier rib layer 220 is, however, not necessarily integrally formed with encapsulation thin film 210, and disparity barrier rib layer 220 may be separately formed from encapsulation thin film 210.

Disparity barrier rib layer 220 is disposed between the several inorganic layers 211, 212, 213, and 214 of encapsulation thin film 210. That is, disparity barrier rib layer 220 is formed in the process of forming the several inorganic layers 211, 212, 213, and 214 of encapsulation thin film 210, and finally disparity barrier rib layer 220 and encapsulation thin film 210 are completed together. Under consideration of the distance between disparity barrier rib layer 220 and organic light emitting element 70, it may be determined whether disparity barrier rib layer 220 is formed between some inorganic layers 212 and 213 among the several inorganic layers 211, 212, 213, and 214 of encapsulation thin film 210. That is, the distance between disparity barrier rib layer 220 and organic light emitting elements 70 may be controlled if necessary.

Also, encapsulation thin film 210 that is integrally formed with disparity barrier rib layer 220 has an overall thickness that is inside the range of 0.1 µm to 10 µm. Accordingly, the distance between disparity barrier rib layer 220 and organic light emitting elements 70 may also be controlled inside the range of 0.1 µm to 10 µm. If the entire thickness of encapsulation thin film 210 is less than 0.1 µm, it is difficult to satisfy the water vapor transmission rate (WVTR) condition of less than $10E-6 \text{ g/m}^2/\text{day}$ that is generally required in organic light emitting diode (OLED) display 101; and if the entire thickness is more than 10 µm, the overall thickness of organic light emitting diode (OLED) display 101 is increased.

By this configuration, organic light emitting diode (OLED) display 101 constructed as the first exemplary embodiment according to the principles of the present invention may effectively display three-dimensional images and may simultaneously reduce the entire thickness.

That is, organic light emitting diode (OLED) display 101 may display the image to be divided to the user to be shown through the left eye and the right eye. Also, organic light emitting element 70 is covered by encapsulation thin film 210, and the entire thickness of organic light emitting diode (OLED) display 101 may be slim.

In addition, the separation distance of disparity barrier rib layer 220 forming the disparity from organic light emitting element 70 may be easily controlled. That is, according to the entire size of organic light emitting diode (OLED) display 101 or the size of the pixel included in organic light emitting diode (OLED) display 101, the position of disparity barrier rib layer 220 may be controlled to form an appropriate disparity.

Next, an internal structure of organic light emitting diode (OLED) display 101 will be described with reference to FIG. 2 and FIG. 3. FIG. 2 is a layout view of a pixel circuit in the organic light emitting diode (OLED) display shown in FIG. 1, and FIG. 3 is a cross-sectional view of display substrate 110 and encapsulation thin film 210 taken along the line III-III of FIG. 2.

Figure 2:
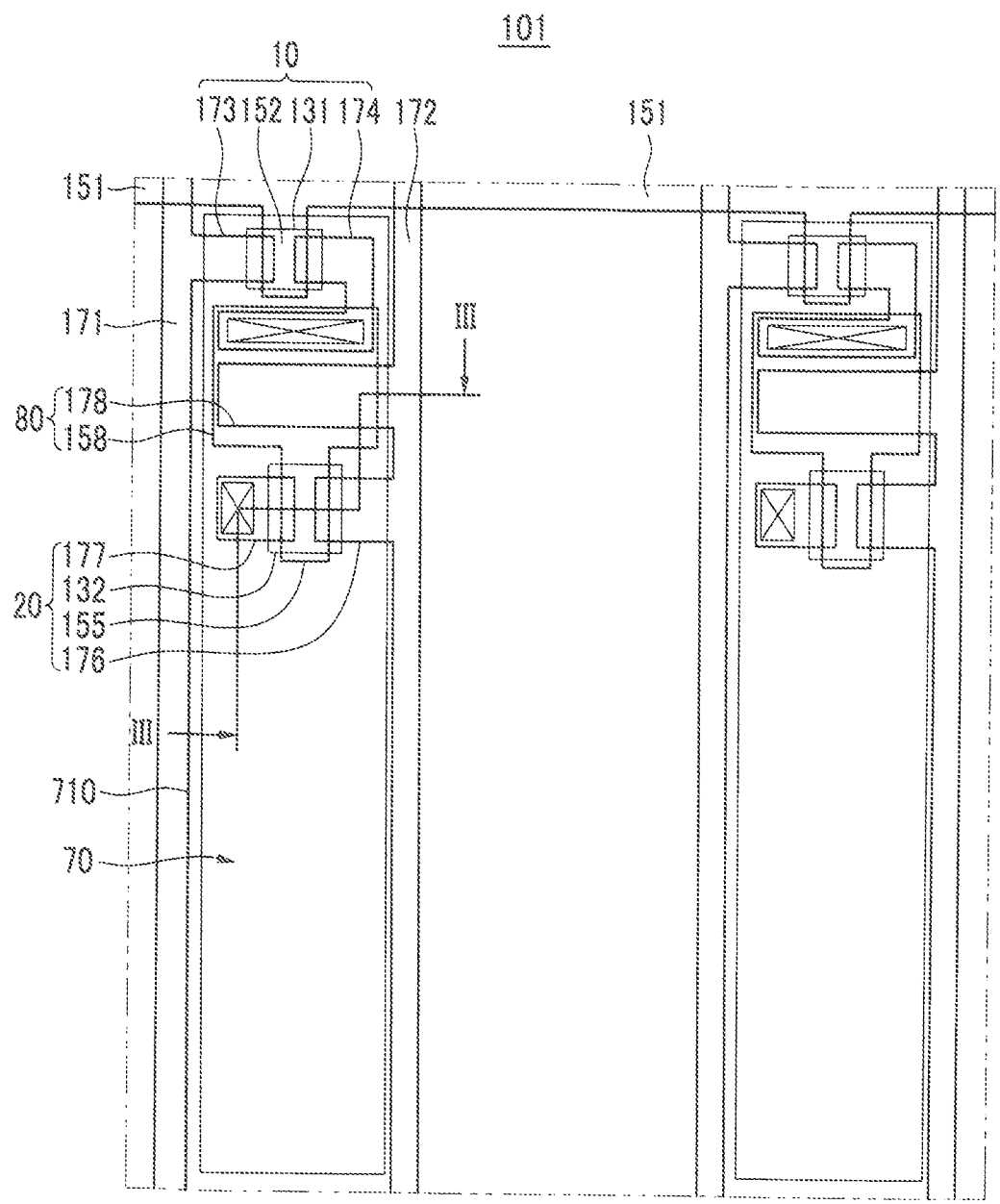
FIG. 2 is a layout view of a pixel circuit in the organic light emitting diode (OLED) display shown in FIG. 1.
Figure 3:
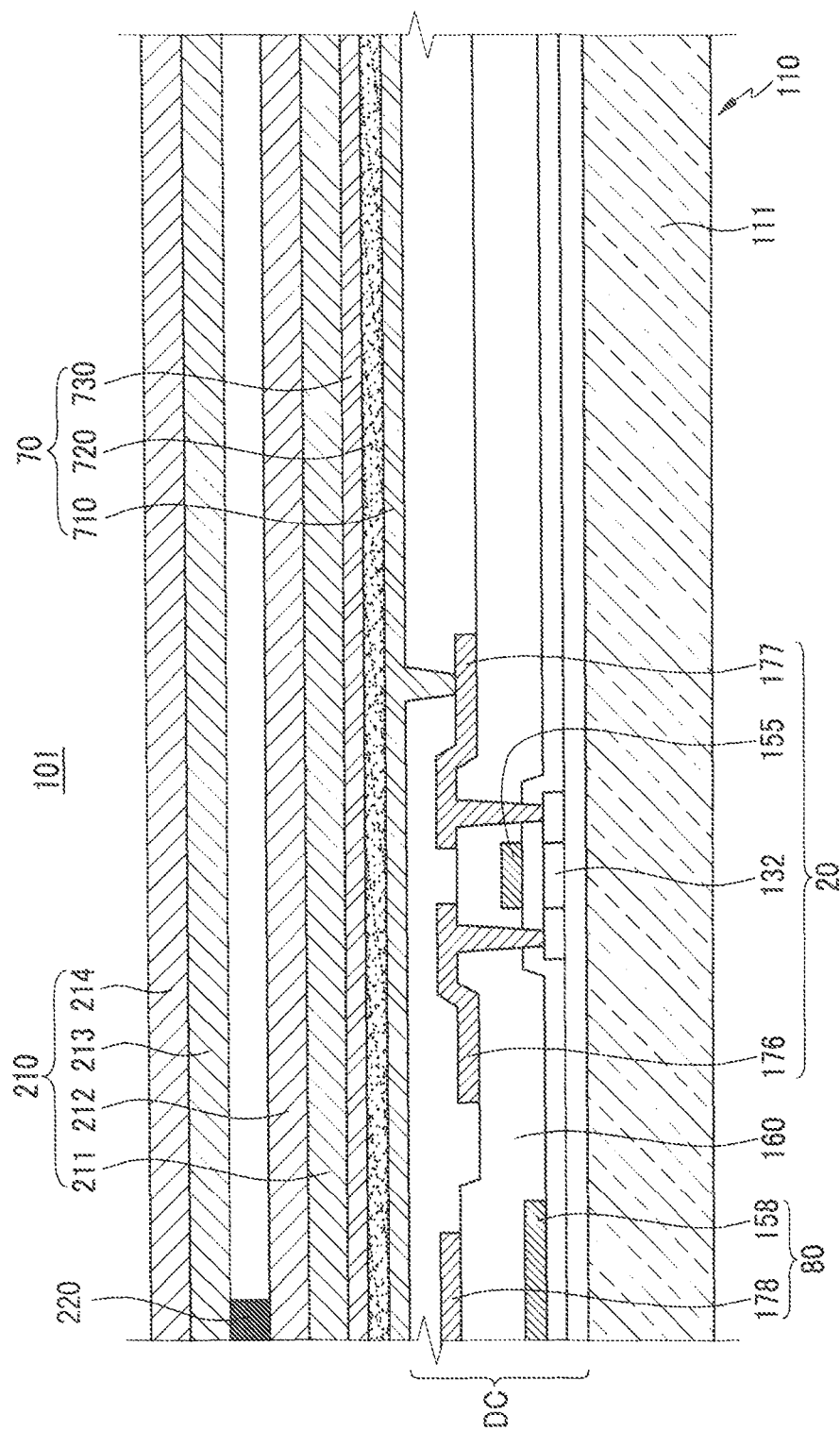
FIG. 3 is a cross-sectional view taken along the line of FIG. 2.

As shown in FIG. 2 and FIG. 3, display substrate 110 includes a switching thin film transistor 10, a driving thin film transistor 20, a capacitor 80, and an organic light emitting element 70 in each pixel. Here, the configuration including switching thin film transistor 10, driving thin film transistor 20, and capacitor 80 is referred to as a driving circuit DC. Also, display substrate 110 further includes gate lines 151 disposed along one direction, data lines 171 intersecting and electrically insulated from gate lines 151, and a common power line 172. Here, one pixel may be defined by gate line 151, data line 171, and common power line 172, but the present invention is not necessarily limited thereto.

Organic light emitting element 70 includes a pixel electrode 710, an organic emission layer 720 formed on pixel electrode 710, and a common electrode 730 formed on organic emission layer 720. Here, pixel electrode 710 is a positive (+) electrode or anode being a hole injection electrode, and common electrode 730 is a negative (−) electrode or cathode being an electron injection electrode. The present invention is, however, not necessarily limited thereto, and depending upon the driving method of organic light emitting diode display 100, pixel electrode 710 may be a cathode, and common electrode 730 may be an anode. Holes and electrons are injected from pixel electrode 710 and common electrode 730 into organic emissive layer 720. When excitons, which are the combinations of the injected holes and electrons, shift from the excited state to the ground state, light is emitted.

Furthermore, with an organic light emitting diode display according to the first exemplary embodiment, organic light emitting diode 70 emits light in the direction of encapsulation substrate 210. That is, organic light emitting diode display 100 is a front emission type. Here, for organic light emitting element 70 to emit the light in the direction of encapsulation substrate 210, pixel electrode 710 is used as a reflective electrode, and common electrode 730 is used as a transmissive or translucent electrode.

Capacitor 80 has a pair of capacitor electrode plates 158 and 178, and an interlayer insulating layer 160 interposed between two capacitor electrode plates 158 and 178. Interlayer insulating layer 160 functions as a dielectric. The capacitance is determined depending upon the electric charges charged at capacitor 80 and the voltages applied to the two capacitor electrode plates 158 and 178.

Switching thin film transistor 10 includes a switching semiconductor layer 131, a switching gate electrode 152, a switching source electrode 173, and a switching drain electrode 174. Driving thin film transistor 20 includes a driving semiconductor layer 132, a driving gate electrode 155, a driving source electrode 176, and a driving drain electrode 177.

Switching thin film transistor 10 is used as a switch for selecting pixels to emit light. Switching gate electrode 152 is connected to gate line 151. Switching source electrode 173 is connected to data line 171. Switching drain electrode 174 is separated from switching source electrode 173, and is connected to one capacitor electrode plate 158.

Driving thin film transistor 20 applies a driving voltage to pixel electrode 710 to excite organic emissive layer 720 of first organic light emitting diode 70 in the selected pixel. Driving gate electrode 155 is connected to capacitor electrode plate 158 which is connected with switching drain electrode 174. Driving source electrode 176 and the other capacitor electrode plate 178 are each connected to common power line 172. Driving drain electrode 177 is connected to pixel electrode 710 of organic light emitting diode 70 through a contact hole.

With the above structure, switching thin film transistor 10 is operated by a gate voltage applied to gate line 151, and transmits a data voltage which is applied to data line 171 to driving thin film transistor 20. A voltage corresponding to a difference between a common voltage applied to driving thin film transistor 20 from common power line 172 and the data voltage transmitted from switching thin film transistor 10 is stored at capacitor 80, and the current corresponding to the voltage stored at capacitor 80 flows to organic light emitting diode 70 through driving thin film transistor 20 to thereby excite organic light emitting diode 70.

As shown in FIG. 3, encapsulation thin film 210 is formed on organic light emitting element 70. Encapsulation thin film 210 includes a plurality of inorganic layers 211, 212, 213, and 214, and a disparity barrier rib layer 220 is formed between the inorganic layers 211, 212, 213, and 214.

Next, a second exemplary embodiment according to the principles of the present invention will be described with reference to FIG. 4.

Figure 4:
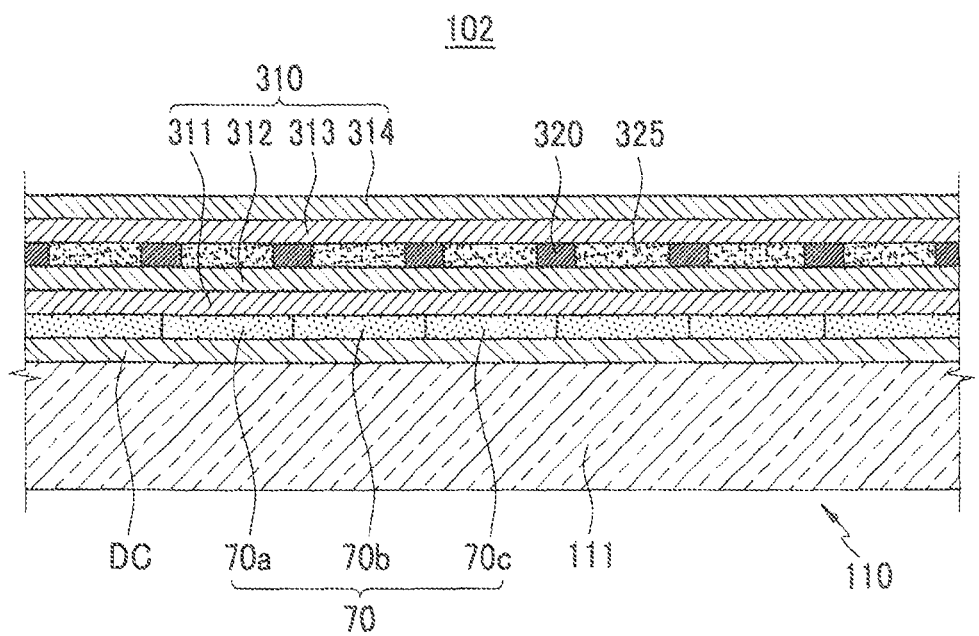
FIG. 4 is a cross-sectional view of an organic light emitting diode (OLED) display constructed as a second exemplary embodiment according to the principles of the present invention.

As shown in FIG. 4, an organic light emitting diode (OLED) display 102 constructed as the second exemplary embodiment includes an encapsulation thin film 310 having a multi-layer structure in which a plurality of inorganic layers 312 and 314 and a plurality of organic layers 311 and 313 are alternately deposited. That is, in encapsulation thin film 310, the plurality of inorganic layers 312 and 314 and the plurality of organic layers 311 and 313 are alternately stacked.

Inorganic layers 312 and 314 may be made of a material including at least one of $Al_2O_3$, $TiO_2$, $ZrO$, $SiO_2$, $AlON$, $AlN$, $SiON$, $Si_3N_4$, $ZnO$, and $Ta_2O_5$, and organics layers 311 and 313 may be made of a material of a polymer group. Here, the polymer group material includes an acryl-based resin, an epoxy group resin, polyimide, and polyethylene.

In more detail, regarding to the operation of encapsulation thin film 310, inorganic layers 312 and 314 has a relative high density in order to firstly suppress the penetration of moisture and oxygen. The penetration of most of the moisture and the oxygen into organic light emitting element 70 is suppressed through inorganic layers 312 and 314.

A minimal amount of moisture and oxygen passing through inorganic layers 312 and 314 is secondly blocked by organic layers 311 and 313. The moisture blocking effect of organic barrier layers 311 and 314 is relatively less than that of inorganic barrier layers 312 and 314. Organic barrier layers 311 and 313, however, not only suppress moisture permeation but also perform as a buffer layer that reduces stress between respective layers 311, 312, 313, and 314 due to twisting of OLED display 102 between inorganic layers 312 and 314. That is, when inorganic barrier layers 312 and 314 are deposited without having organic barrier layers 311 and 312 therebetween, stress occurs between inorganic barrier layers 312 and 314 due to twisting of OLED display 102, and the stress causes damage to encapsulation thin film 310, thereby remarkably deteriorating the moisture blocking function of thin film encapsulation layer 210. As described, since organic barrier layers 311 and 313 suppress the moisture permeation and performs as the buffer layer, encapsulation thin film layer 310 can stably prevent permeation of moisture and oxygen.

Also, as shown in FIG. 4, encapsulation thin film 310 includes two inorganic layers 312 and 314 and two organic layers 311 and 313; the second exemplary embodiment is, however, not limited thereto. Accordingly, the encapsulation thin film 310 may be variously made of two or more inorganic layers and organic layers if necessary. The arrangement order of the layers forming encapsulation thin film 310 may also be variously changed.

Disparity barrier rib layer 320 is disposed between inorganic layers 312 and 314 and organic layers 311 and 313. Also, a filler layer 325 filling the space where disparity barrier rib layer 320 is not formed is formed within the same layer as disparity barrier rib layer 320. Organic light emitting diode (OLED) display 102 according to the second exemplary embodiment is, however, not limited thereto, and filler layer 325 may be omitted.

Filler layer 325 has a relatively similar refractive index to neighboring inorganic layer 312 and organic layer 313. That is; the refractive index difference between inorganic layer 312 and organic layer 313 and the air is more than the refractive index difference between inorganic layer 312 and organic layer 313 and filler 325. Accordingly, loss of the light passing through encapsulation thin film 310 may be reduced.

Disparity barrier rib layer 320 may be made of one of the organic layer and the inorganic layer including the light blocking component. That is, disparity barrier rib layer 320 may be formed of an organic material including a pigment such as carbon black or titanium oxide, or an inorganic material including chromium, chromium oxide, chromium nitride, or other metal oxides.

By this configuration, organic light emitting diode (OLED) display 102 constructed as the second exemplary embodiment according to the principles of the present invention may effectively display three-dimensional images and simultaneously reduce the overall thickness.

Further, encapsulation thin film 310 is formed by alternately depositing inorganic layers 312 and 314 and organic layers 311 and 313 such that encapsulation thin film 310 may be prevented from being damaged due to the stress generated between layers 311, 312, 313, and 314 of encapsulation thin film 310. Accordingly, organic light emitting diode (OLED) display 102 according to the second exemplary embodiment further stably protects the organic light emitting element 70.

Also, filler 325 filling the space where disparity barrier rib layer 320 is not disposed is formed within the same layer as disparity barrier rib layer 320 such that the loss of light passing through encapsulation thin film 310 may be reduced.

Next, a third exemplary embodiment according to the principles of the present invention will be described with reference to FIG. 5.

Figure 5:
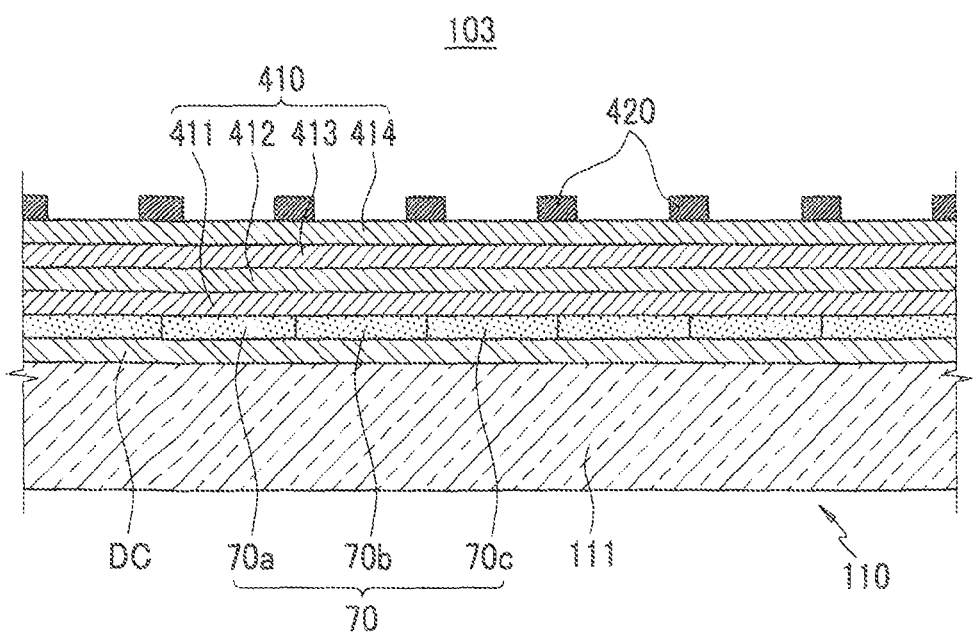
FIG. 5 is a cross-sectional view of an organic light emitting diode (OLED) display constructed as a third exemplary embodiment according to the principles of the present invention.

As shown in FIG. 5, in an organic light emitting diode (OLED) display 103 according to the third exemplary embodiment, a disparity barrier rib layer 420 is formed on encapsulation thin film 410. That is, encapsulation thin film 410 includes several layers 411, 412, 413, and 414, and disparity barrier rib layer 420 is disposed on the highest and uppermost layer 414 separated furthermost from organic light emitting element 70 among the several layers 411, 412, 413, and 414 of encapsulation thin film 410.

In the third exemplary embodiment, encapsulation thin film 410 may be formed of a multi-layer structure in which a plurality of inorganic layers are deposited, or a plurality of inorganic layers and a plurality of organic layers are alternately deposited.

By this configuration, organic light emitting diode (OLED) display 103 according to the third exemplary embodiment may effectively display three-dimensional images and simultaneously reduce the entire thickness.

Also, encapsulation thin film 410 may be further stably formed. That is, when disparity barrier rib layer 420 is formed inside encapsulation thin film 410, the moisture blocking function of encapsulation thin film 410 may be deteriorated due to disparity barrier rib layer 420. When disparity barrier rib layer 420 is formed on highest layer 414 of encapsulation thin film 410, however, the moisture blocking function of encapsulation thin film 410 may be prevented from being deteriorated. Also, it is easy for encapsulation thin film 410 and disparity barrier rib layer 420 to be integrally formed such that the overall productivity of organic light emitting diode (OLED) display 103 may be improved.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device comprising:
   a substrate main body;
   a plurality of organic light emitting elements formed on the substrate main body;
   an encapsulation thin film formed on the substrate main body thereby covering the plurality of organic light emitting elements, wherein the encapsulation thin film is a multi-layer structure composed of a plurality of inorganic layers; and
   a disparity barrier rib layer including a plurality of barrier ribs arranged at locations that correspond to boundary regions disposed between the plurality of organic light emitting elements, the disparity barrier rib layer to produce a three dimensional image by spatially separating an image produced by the organic light emitting elements into a left-eye image and a right-eye image, wherein the disparity barrier rib layer is disposed between the plurality of inorganic layers, the encapsulation thin film and the disparity barrier rib layer being formed integrally together with one another.

2. The organic light emitting diode (OLED) display device of claim 1, wherein one organic light emitting element among the plurality of organic light emitting elements emits light of a color different from the color of the light emitted by at least one among neighboring organic light emitting elements.

3. The organic light emitting diode (OLED) display device of claim 1, wherein the disparity barrier rib layer is formed of one of an organic layer and an inorganic layer including a light blocking component.

4. The organic light emitting diode (OLED) display device of claim 1, wherein the disparity barrier rib layer is separated from the plurality of organic light emitting elements by a distance in a range of approximately 0.1 μm to approximately 10 μm.

5. The organic light emitting diode (OLED) display device of claim 1, wherein the encapsulation thin film has a thickness in a range of approximately 0.1 μm to approximately 10 μm.

6. The organic light emitting diode (OLED) display device of claim 1, wherein each of the inorganic layers is comprised of a material including at least one of $Al_2O_3$, $TiO_2$, ZrO, $SiO_2$, AlON, AlN, SiON, $Si_3N_4$, ZnO, and $Ta_2O_5$.

7. The organic light emitting diode (OLED) display device of claim 1, further comprising a filler layer filling the space where the disparity barrier rib layer is not formed and being disposed within the same layer as the disparity barrier rib layer.

8. The organic light emitting diode (OLED) display device of claim 1, with the disparity barrier rib layer being comprised of one of an organic material including a pigment selected from a group consisting of carbon black and titanium oxide, or an inorganic material including one of chromium, chromium oxide, chromium nitride or anther metal oxide.

9. An organic light emitting diode (OLED) display device comprising:
   a substrate main body;
   a plurality of organic light emitting elements formed on the substrate main body;
   an encapsulation thin film formed on the substrate main body thereby covering the plurality of organic light emitting elements; and
   a disparity barrier rib layer formed in correspondence with a plurality of boundary regions disposed between the plurality of organic light emitting elements, wherein the encapsulation thin film and the disparity barrier rib layer are integrally formed, wherein the encapsulation thin film is formed with a multi-layer structure in which a plurality of inorganic layers and a plurality of organic layers are alternately deposited.

10. The organic light emitting diode (OLED) display device of claim 9, wherein the inorganic layer is formed of a material including at least one of $Al_2O_3$, $TiO_2$, ZrO, $SiO_2$, AlON, AlN, SiON, $Si_3N_4$, ZnO, and $Ta_2O_5$, and the organic layer is made of a material selected from a polymer group.

11. The organic light emitting diode (OLED) display device of claim 10, the polymer group comprises an acryl-based resin, an epoxy group resin, polyimide, and polyethylene.

12. The organic light emitting diode (OLED) display device of claim 9, wherein the disparity barrier rib layer is disposed between the plurality of inorganic layers and organic layers.

13. The organic light emitting diode (OLED) display device of claim 12, further comprising a filler layer filling the space where the disparity barrier rib layer is not formed and being disposed within the same layer as the disparity barrier rib layer.

14. The organic light emitting diode (OLED) display device of claim 9, wherein the disparity barrier rib layer is disposed on the highest layer that is furthermost from the plurality of organic light emitting elements.

15. An organic light emitting diode (OLED) display device comprising:
   a substrate main body;
   a plurality of organic light emitting elements formed on the substrate main body;
   an encapsulation thin film formed on the substrate main body thereby covering the plurality of organic light emitting elements; and
   a disparity barrier rib layer is disposed on top of and external to the encapsulation thin film, the disparity barrier rib layer including a plurality of barrier ribs arranged at locations that correspond to boundary regions disposed between the plurality of organic light emitting elements, the disparity barrier rib layer to produce a three dimensional image by spatially separating an image produced by the organic light emitting elements into a left-eye image and a right-eye image.

16. The organic light emitting diode (OLED) display device of claim 15, wherein the encapsulation thin film is a multi-layer structure composed of a plurality of inorganic layers.

* * * * *